(12) United States Patent
Coffy et al.

(10) Patent No.: US 9,136,292 B2
(45) Date of Patent: Sep. 15, 2015

(54) OPTICAL ELECTRONIC PACKAGE HAVING A BLIND CAVITY FOR COVERING AN OPTICAL SENSOR

(75) Inventors: Romain Coffy, Saint Martin le Vinoux (FR); Remi Brechignac, Grenoble (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 559 days.

(21) Appl. No.: 13/541,066

(22) Filed: Jul. 3, 2012

(65) Prior Publication Data

US 2013/0012276 A1     Jan. 10, 2013

(30) Foreign Application Priority Data

Jul. 8, 2011  (FR) ...................................... 11 56226

(51) Int. Cl.
*H01L 27/00* (2006.01)
*H01L 27/146* (2006.01)
*G01S 7/481* (2006.01)
(Continued)

(52) U.S. Cl.
CPC ......... *H01L 27/14618* (2013.01); *G01S 7/4813* (2013.01); *G01S 17/026* (2013.01); *H01L 25/167* (2013.01); *H01L 31/167* (2013.01); *H01L 31/173* (2013.01); *H01L 27/14603* (2013.01); *H01L 27/14643* (2013.01); *H01L 27/14647* (2013.01); *H01L 27/14687* (2013.01); *H01L 27/14689* (2013.01); *H01L 33/486* (2013.01); *H01L 33/54* (2013.01); *H01L 2224/48227* (2013.01); *H01L 2224/49175* (2013.01)

(58) Field of Classification Search
CPC ............ H01L 25/167; H01L 27/14647; H01L 27/14643; H01L 27/14687; H01L 27/14689; H01L 27/14603
See application file for complete search history.

(56) References Cited

U.S. PATENT DOCUMENTS

| 5,130,531 A | 7/1992 | Ito et al. |
| 5,226,052 A | 7/1993 | Tanaka et al. |

(Continued)

FOREIGN PATENT DOCUMENTS

| DE | 19616969 A1 | 10/1997 |
| EP | 0992824 A2 | 4/2000 |

OTHER PUBLICATIONS

INPI Search Report and Written Opinion for FR1156226 mailed Feb. 2, 2012 (8 pages).

*Primary Examiner* — Kimberly Rizkallah
*Assistant Examiner* — Alexander Belousov
(74) *Attorney, Agent, or Firm* — Gardere Wynne Sewell LLP (57) ABSTRACT

An electronic package includes a substrate wafer having front and rear faces. An emitting integrated circuit chip is mounted to the front face of the substrate wafer and includes a light radiation optical emitter. A receiving integrated circuit chip is also mounted to the front face of the substrate wafer and includes at least one light radiation optical sensor. A transparent encapsulant extends above the optical sensor and the optical emitter. An opaque encapsulant encapsulates the transparent encapsulant. The opaque encapsulant has a front window situated above the optical emitter and which is offset laterally relative to the optical sensor. The transparent encapsulant accordingly has an uncovered front face situated above the optical emitter and offset laterally relative to the optical sensor. The opaque encapsulant may include an additional front window. The receiving integrated circuit chip further includes a second optical sensor situated opposite the additional front window.

20 Claims, 11 Drawing Sheets

(51) Int. Cl.
*G01S 17/02* (2006.01)
*H01L 25/16* (2006.01)
*H01L 31/167* (2006.01)
*H01L 31/173* (2006.01)
*H01L 33/48* (2010.01)
*H01L 33/54* (2010.01)

(56) References Cited

U.S. PATENT DOCUMENTS

| | | |
|---|---|---|
| 6,787,869 B1 | 9/2004 | Vittu |
| 7,539,366 B1 | 5/2009 | Baks et al. |
| 2003/0111588 A1 | 6/2003 | Chen |
| 2005/0254758 A1 | 11/2005 | Kropp |
| 2009/0045498 A1* | 2/2009 | Braden et al. ............. 257/687 |
| 2009/0051804 A1* | 2/2009 | Nomura et al. ............ 348/344 |
| 2010/0096659 A1 | 4/2010 | Noma |
| 2010/0259766 A1* | 10/2010 | Wiese et al. ............... 356/614 |
| 2011/0024627 A1 | 2/2011 | Yao |
| 2011/0057102 A1 | 3/2011 | Yao |
| 2011/0057108 A1 | 3/2011 | Yao et al. |
| 2011/0057129 A1* | 3/2011 | Yao et al. ................... 250/552 |
| 2011/0204233 A1 | 8/2011 | Costello et al. |

* cited by examiner

OPTICAL ELECTRONIC PACKAGE HAVING A BLIND CAVITY FOR COVERING AN OPTICAL SENSOR

PRIORITY CLAIM

This application claims priority from French Application for Patent No. 1156226 filed Jul. 8, 2011, the disclosure of which is hereby incorporated by reference.

TECHNICAL FIELD

The present invention relates to the field of electronic packages comprising, for example, optical electronic devices.

BACKGROUND

An electronic package is known which comprises a mounting plate, a first integrated circuit chip provided with a first optical detector, a second integrated circuit chip provided with a second optical detector, and a third integrated circuit chip provided with an optical emitter, these three chips being bonded onto the mounting plate. An opaque cover is bonded onto the periphery of the mounting plate and optically insulates each of the chips by virtue of the existence of three separate chambers. The cover has three separate openings, formed facing the three abovementioned optical elements and provided with three transparent protection plates.

This known electronic package requires the use of a mounting plate and the fabrication of a specially dimensioned cover, involves numerous mounting steps and external electrical connection difficulties regarding the integrated circuit chips and has large dimensions compared to the size of the integrated circuit chips.

SUMMARY

The aim of the present invention is to propose an electronic package which is generally simpler and consequently less costly.

An electronic package is proposed which comprises: a substrate wafer having a front face and a rear face; an emitting integrated circuit chip having a rear face fixed to the front face of the substrate wafer and comprising, in a front face, a light radiation optical emitter; and a receiving integrated circuit chip having a rear face fixed to the front face of the substrate wafer and comprising, in a front face, at least one light radiation optical sensor.

The proposed electronic package also comprises: a transparent encapsulation means extending above the optical sensor and the optical emitter; and an opaque encapsulation means encapsulating the transparent encapsulation means, this opaque encapsulation means having a front window which is situated above the optical emitter and which is offset laterally relative to the optical sensor, so that the transparent encapsulation means has an uncovered front face situated above the optical emitter and offset laterally relative to the optical sensor and so that the transparent encapsulation means extends in a cavity of the opaque encapsulation means, this cavity being blind towards the front and open laterally on the side of the front window.

The transparent encapsulation means may comprise a transparent plate placed above the optical sensor and a transparent encapsulation block in which are embedded the receiving integrated circuit chip and at least a part of this transparent plate.

The transparent encapsulation means may comprise a transparent encapsulation block in which are embedded the emitting integrated circuit chip and at least the part of the receiving integrated circuit chip including the optical sensor.

The opaque encapsulation means may comprise an opaque encapsulation block in which are embedded the receiving integrated circuit chip and the transparent encapsulation means.

The opaque encapsulation means may comprise an opaque ring inside which are placed the optical emitter and the optical sensor, in which the transparent encapsulation means comprises a transparent encapsulation block formed in this ring and in which the opaque encapsulation means also comprises a layer extending at least over the transparent encapsulation block and locally above the optical sensor.

An electronic package is proposed which comprises: a substrate wafer having a front face and a rear face; an emitting integrated circuit chip having a rear face fixed to the front face of the substrate wafer and comprising, in a front face, a light radiation optical emitter; and a receiving integrated circuit chip having a rear face fixed to the front face of the substrate wafer and comprising, in a front face, at least one main light radiation optical sensor and one secondary light radiation optical sensor.

The proposed electronic package comprises a transparent encapsulation means extending above the optical emitter and the secondary optical sensor; a main transparent plate situated above the main optical sensor; and an opaque encapsulation means encapsulating the transparent encapsulation means and the main transparent plate, said opaque encapsulation means having a front window which is situated above the optical emitter and which is offset laterally relative to the optical sensor, so that the transparent encapsulation means has an uncovered front face situated above the optical emitter and offset laterally relative to the optical sensor and so that the transparent encapsulation means extends in a cavity of the opaque encapsulation means, this cavity being blind towards the front and open laterally on the side of the front window, said opaque encapsulation means not covering said main plate and said opaque encapsulation means passing between the main optical sensor and the secondary optical sensor.

The transparent encapsulation means may comprise a transparent plate placed above the secondary optical sensor and a transparent encapsulation block in which are embedded the receiving integrated circuit chip and at least a part of this transparent plate.

The transparent encapsulation means may comprise a transparent encapsulation block in which are embedded the emitting integrated circuit chip and the part of the receiving integrated circuit chip including the secondary optical sensor.

The opaque encapsulation means may comprise an opaque encapsulation block in which are embedded the transparent encapsulation means, the part of the receiving integrated circuit chip including the main optical sensor and, partially, the main transparent plate.

The opaque encapsulation means may comprise an opaque ring inside which are placed the optical emitter and the secondary optical sensor, in which the transparent encapsulation means may comprise a transparent encapsulation block formed in this ring and in which the opaque encapsulation means may also comprise a layer extending at least over the transparent encapsulation block and locally above the secondary optical sensor.

The substrate wafer may comprise an electrical connection network linked to said integrated circuit chips and is provided with external electrical connection elements.

Also proposed is a portable or mobile telephone comprising, internally, an electronic package as described previously and in which the shell of the telephone has at least one opening situated at least facing at least one of said through passages.

BRIEF DESCRIPTION OF THE DRAWINGS

Electronic packages according to the present invention will now be described by way of nonlimiting examples, illustrated by the appended drawing in which.

DETAILED DESCRIPTION OF THE DRAWINGS

Figure 1:
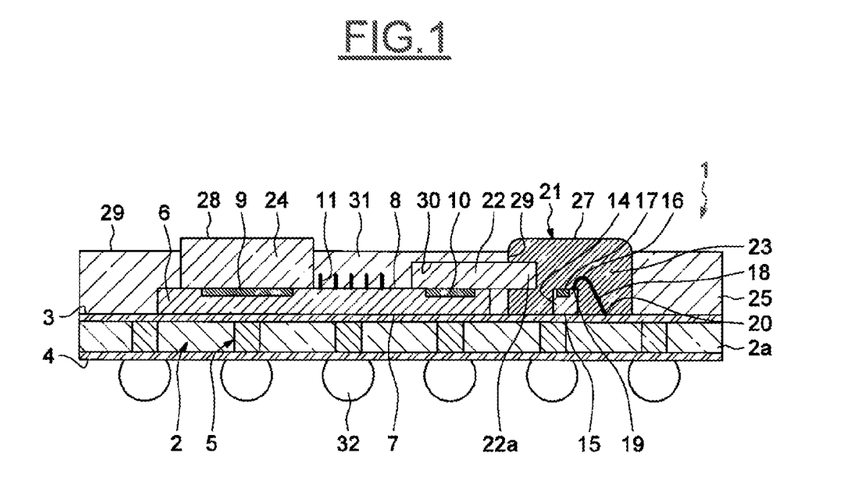
FIG. 1 represents a longitudinal cross section of an electronic package.
Figure 2:
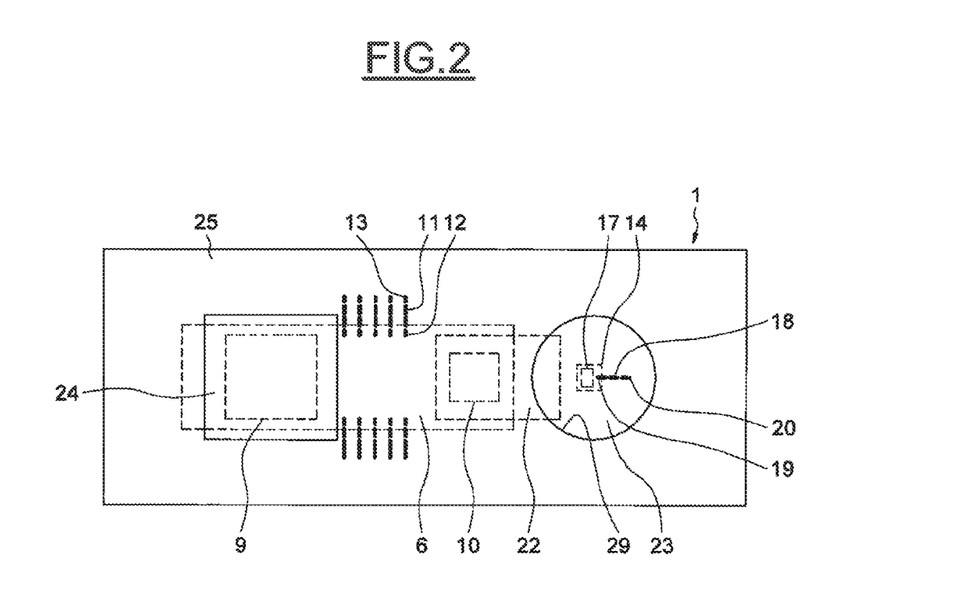
FIG. 2 represents a plan view of the electronic package of FIG. 1.

As illustrated in FIGS. 1 and 2, an electronic package 1 comprises an opaque substrate wafer 2 which has opposing front and rear faces 3 and 4 and which comprises an electrically insulating material 2a and an integrated electrical connection network 5 for making the electrical connections from one face to the other and on the faces 3 and 4.

The electronic package 1 comprises a receiving integrated circuit chip 6, the rear face 7 of which is fixed to the front face 3 of the substrate wafer 2, for example via a layer of glue, and the front face 8 of which comprises, on areas spaced apart, a main integrated light radiation optical sensor 9 and a secondary integrated light radiation optical sensor 10, spaced apart from one another.

The integrated circuit chip 6 is electrically connected to the electrical connection network 5 of the substrate wafer 2 via a plurality of electrical connection wires 11 which selectively link bump contacts 12 of the front face of the integrated circuit chip 6 and bump contacts 13 of the front face 3 of the substrate wafer 2.

The electronic package 1 comprises an emitting integrated circuit chip 14, the rear face 15 of which is fixed to the front face 3 of the substrate wafer 2, for example via a layer of conductive glue, and the front face 16 of which comprises, over an area, an integrated optical emitter 17 suitable for emitting a light radiation in front of its front face 16.

The emitting integrated circuit chip 14 is electrically connected to the electrical connection network 5 of the substrate wafer 2 via at least one electrical connection wire 18 which links a bump contact 19 of the front face of the integrated circuit chip 14 and a bump contact 20 of the front face 3 of the substrate wafer 2.

According to a particular exemplary embodiment, the substrate wafer 2 is rectangular, the receiving integrated circuit chip 6 is rectangular and extends longitudinally along the longitudinal axis of the substrate wafer 2 and the integrated circuit chip 14 is also placed along the longitudinal axis of the substrate wafer 2. The main optical sensor 9, the secondary optical sensor 10 and the optical emitter 17 are also placed along the longitudinal axis of the substrate wafer 2, the optical emitter 17 being on the side of the secondary optical sensor 10.

The electronic package 1 comprises a transparent or translucent encapsulation means 21 to optically couple the optical emitter 17 to the secondary optical sensor 10, in other words suitable for a part of the light radiation emitted by the optical emitter 17 to reach the secondary optical sensor 10.

The encapsulation means 21 comprises a transparent or translucent rectangular plate 22, for example made of glass, which is fixed to the front face 8 of the integrated circuit chip 6, for example via a layer of transparent glue, and which has a part which covers the secondary optical sensor 10 and a part which extends as an overhang in the direction of the integrated circuit chip 14, without, however, reaching or covering the latter.

The encapsulation means 21 comprises an encapsulation block 23 made of a transparent material, formed on the front face 3 of the substrate wafer 2 and in which the integrated circuit chip 14, the electrical connection wire 18 and the overhanging end part of the transparent plate are embedded. The encapsulation block 23, for example made of a transparent resin, is approximately in the form of a dome which extends towards the front beyond the front face of the transparent plate 22.

The electronic package 1 also comprises a main transparent rectangular plate 24, for example made of glass, which is fixed to the front face 8 of the integrated circuit chip 6, for example via a layer of transparent glue, and which covers the main optical sensor 9. The thickness of the transparent plate 24 is greater than the thickness of the transparent plate 22.

The electronic package 1 also comprises an opaque encapsulation means formed by an encapsulation block 25 made of an opaque material, for example made of an opaque epoxy resin, which is formed on the front face 3 of the substrate wafer 2 and in which are embedded the integrated circuit chip 6, the electrical connection wires 11, partly the transparent encapsulation means 21 and partly the transparent plate 24, so that the encapsulation block 25 has a front face 26 parallel to the front face 3 of the substrate wafer 2, so that only a front face 27 of the transparent encapsulation block 23 and a front face 28 of the transparent plate 24 are not covered, and so that the part of the transparent plate 22 situated outside the transparent encapsulation block 23 is encapsulated and covered. According to a variant embodiment, the transparent encapsulation block 23 and the transparent plate 24 extend towards the outside beyond the front face 26 of the opaque encapsulation block 25.

Thus, the front face 27 of the transparent encapsulation block 23, not covered by the opaque encapsulation block 25, is situated above the optical emitter 17 of the emitting integrated circuit chip 14, the opaque encapsulation block 25 determining a front window 29 surrounding the front face 27 and offset laterally relative to the secondary optical sensor 10. The part of the transparent plate situated outside the transparent encapsulation block 23 and above the secondary optical sensor 10 of the receiving integrated circuit chip 6 extends into a cavity 30 of the opaque encapsulation block 25, blind towards the front and open laterally on the side of the front window 29. The opaque encapsulation block 25, which extends over the receiving integrated circuit chip 6 and fills the space between the transparent plates 22 and 24, forms an opaque barrier 31 between the main optical sensor 9 and the secondary optical sensor 10 of the receiving integrated circuit chip 6.

To electrically link the electronic package 1 to another component such as a printed circuit board (not represented), the rear face 4 of the substrate wafer 2 may be provided with metallic electrical connection elements 32, such as balls, placed on rear bump contacts of the electrical connection network 5.

The electronic package 1 operates as follows.

The light radiation emitted by the optical emitter 17 of the emitting integrated circuit chip 14 is emitted into the material of the transparent encapsulation block 23, is diffused in this block 23 and in the transparent plate 22, is diffused towards the outside through the front face 28 of the transparent encapsulation block 23. The light radiation, which is diffused in the material of the transparent encapsulation block 23, also reaches the secondary optical sensor 10 of the receiving integrated circuit chip 6.

Moreover, the main optical sensor 9 of the receiving integrated circuit chip 6 receives the outside light radiation through the transparent plate 24.

Thus, the secondary optical sensor 10 of the receiving integrated circuit chip 6 receives light radiation mostly from the optical emitter 17 and secondarily from the outside through the offset front window 29, the signal from the secondary optical sensor 10 being able to form a reference for the analysis of the signal from the main optical sensor 9 of the receiving integrated circuit chip 6. The part of the opaque encapsulation block 25 into which extends the transparent plate 22 forms a protection or a screen laterally and above the secondary sensor 10 against the outside light radiation.

The result of the above is that the electronic package 1 can be used as a proximity sensor.

The electronic package 1 can be obtained from collective fabrication that will now be described.

Figure 3:
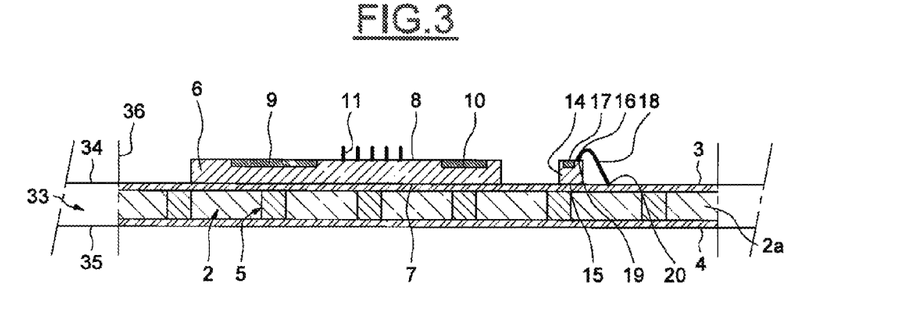
FIGS. 3 to 11 represent fabrication steps of the electronic package of FIG. 1.
Figure 4:
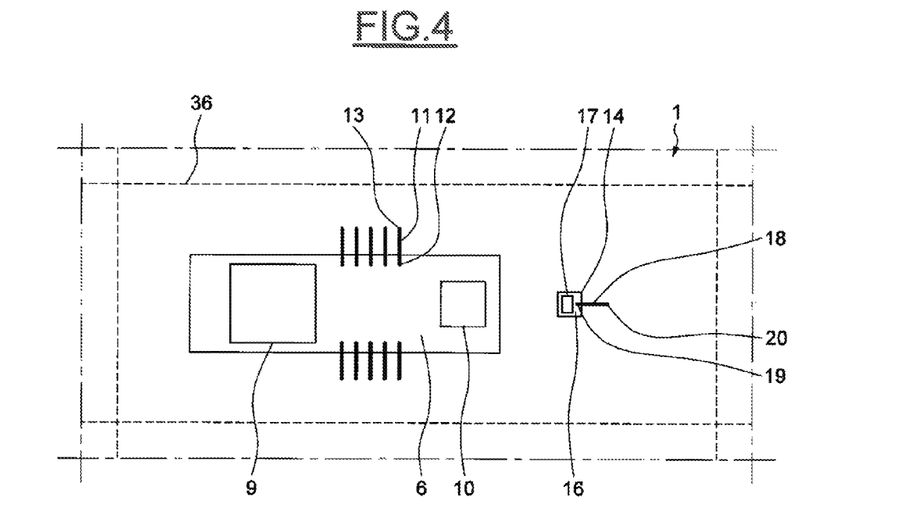
Figure 5:
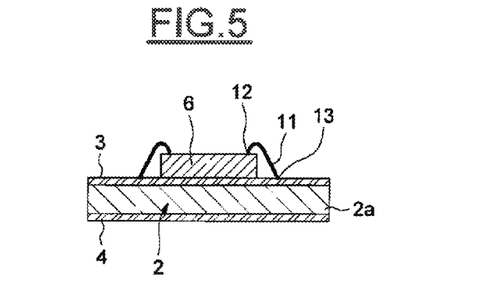

As illustrated in FIGS. 3 to 5, there is a collective substrate wafer 33 having front and rear faces 34 and 35, and having a plurality of adjacent placements 36 established according to a matrix and corresponding to a plurality of electronic packages 1 to be produced. In each placement 36, the collective substrate wafer 33 comprises an electrical connection network 5.

In each placement, the receiving integrated circuit chip 6 and the emitting integrated circuit chip 14 are installed and the electrical connection wires 11 and 18 are placed.

Figure 6:
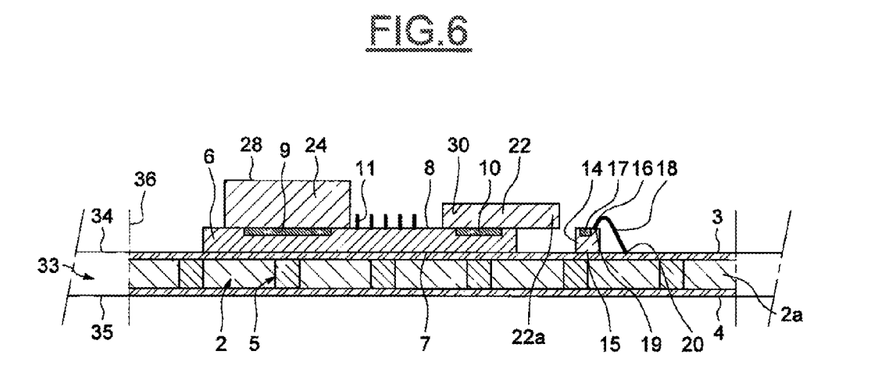
Figure 7:
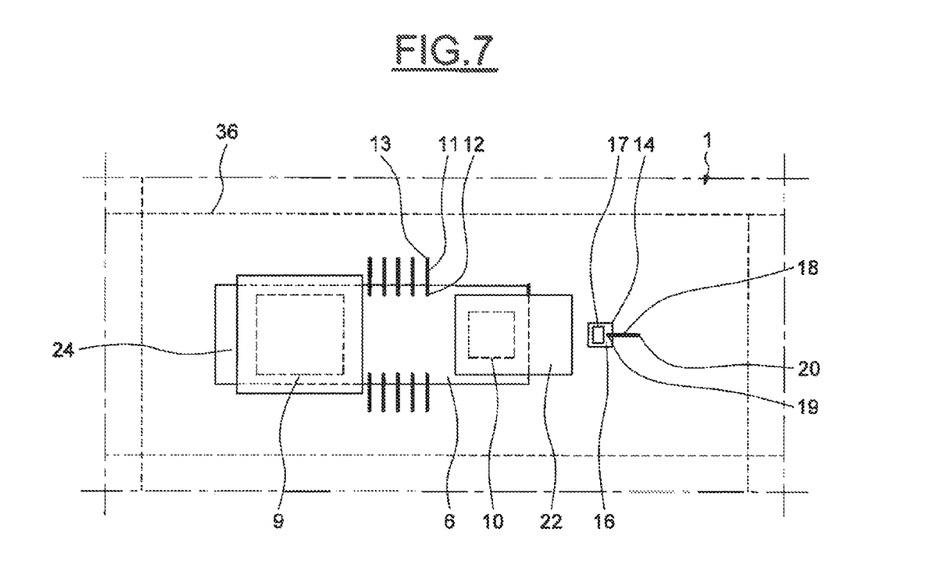

Then, as illustrated in FIGS. 6 and 7, the transparent plates 22 and 24 are installed in each placement.

Figure 8:
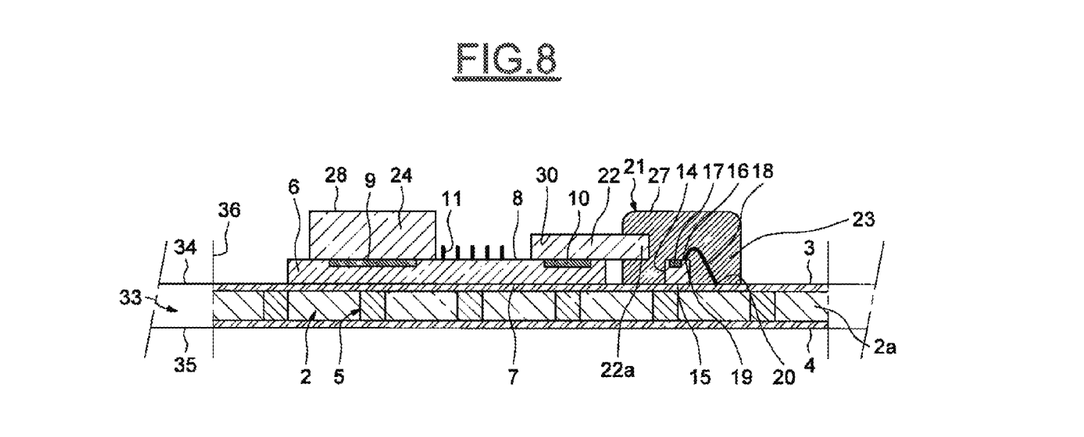
Figure 9:
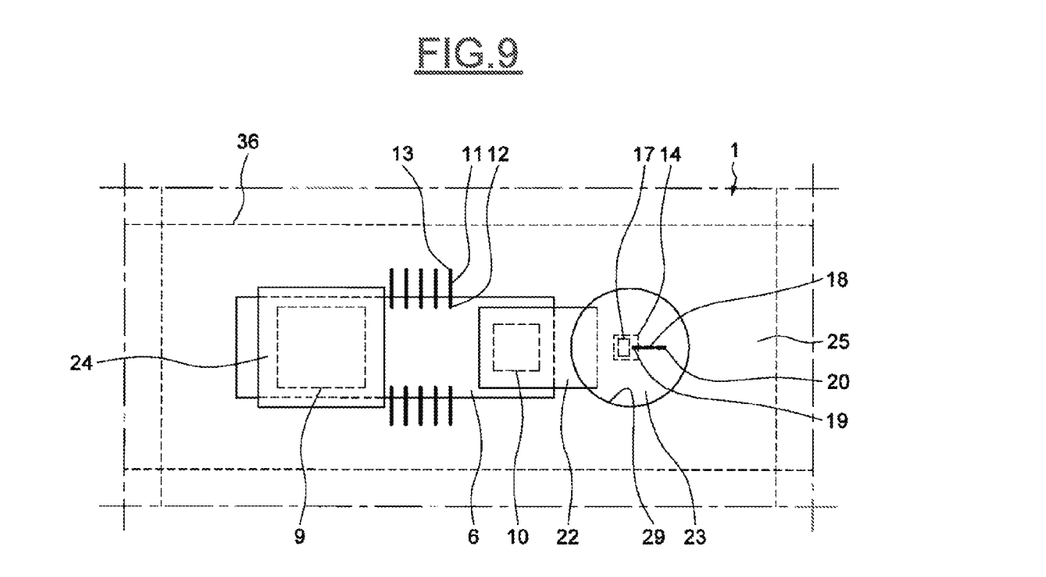

Then, as illustrated in FIGS. 8 and 9, a drop of a liquid transparent material, which may be a transparent glue which hardens under the effect of ultraviolet radiation and which, after hardening, forms the transparent encapsulation block 23, is placed in each placement 36.

Figure 10:
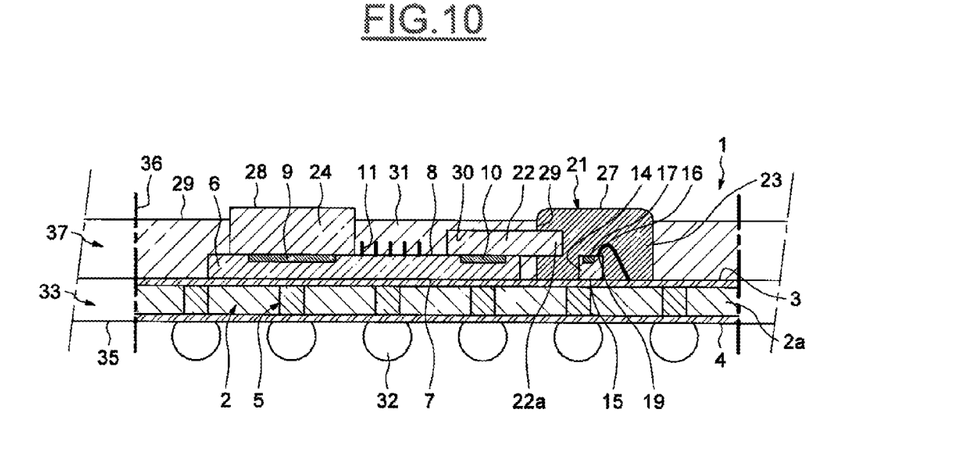
Figure 11:
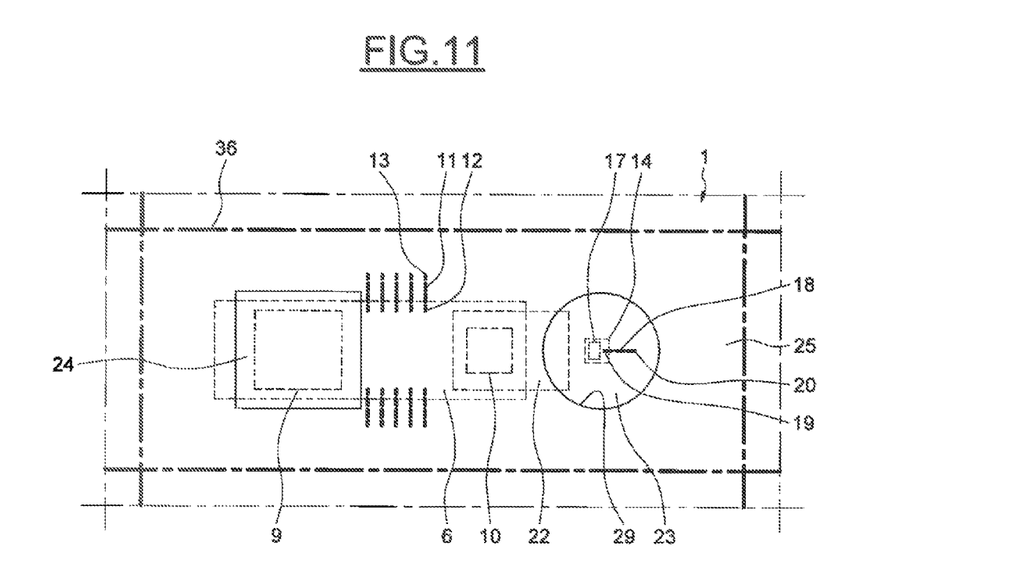

Then, as illustrated in FIGS. 10 and 11, a layer 37 of a liquid material is spread, which, after hardening, forms an opaque encapsulation block 25 in each placement 36.

Then, after having installed the electrical connection elements 32, the different electronic packages 1 are singularized by cutting along the edges of the placements 36.

Figure 12:
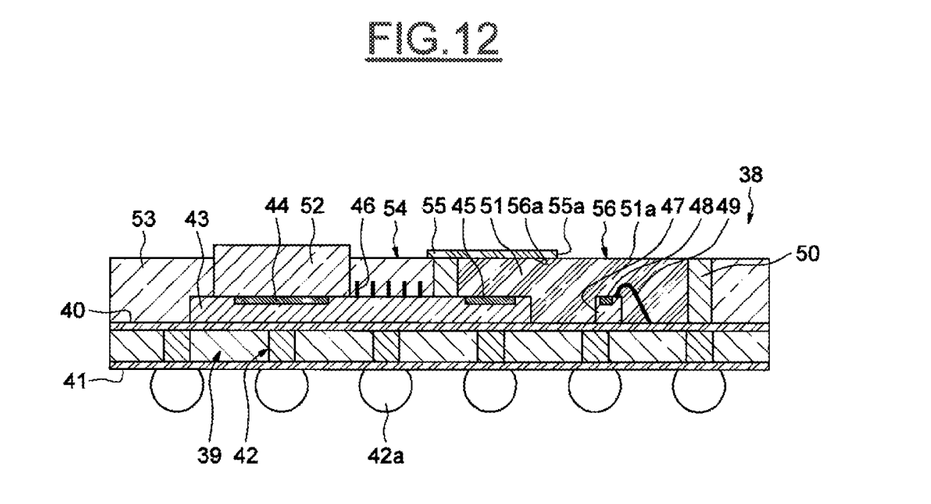
FIG. 12 represents a longitudinal cross section of another electronic package.
Figure 13:
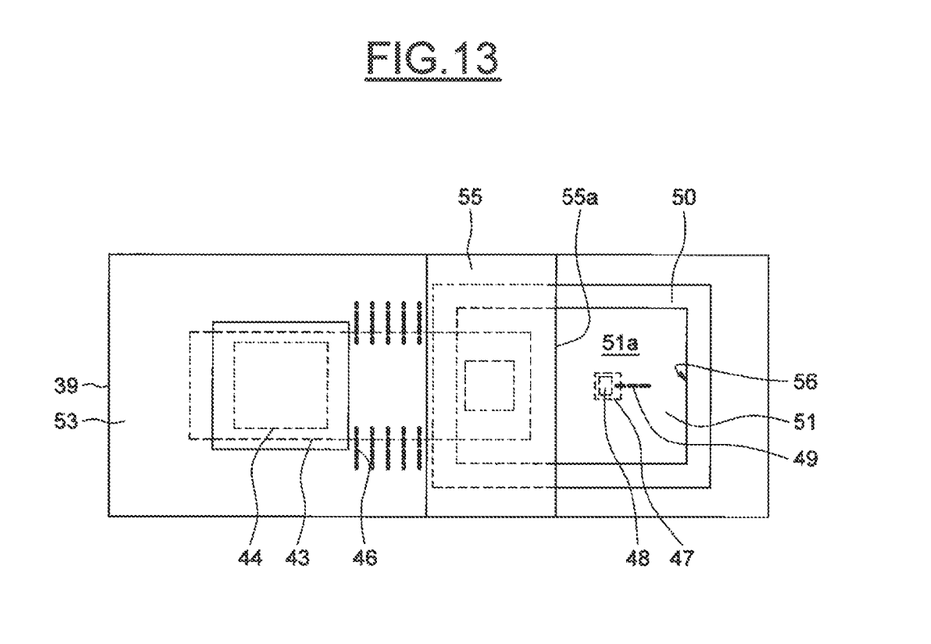
FIG. 13 represents a plan view of the electronic package of FIG. 12.

Referring to FIGS. 12 and 13, it can be seen that another electronic package 38 is represented which can operate optically in a manner equivalent to the electronic package 1.

The electronic package 38 comprises, like the electronic package 1, a substrate wafer 39 having a front face 40 and a rear face 41 and comprising an electrical connection network 42, a receiving integrated circuit chip 43 provided with a main optical sensor 44 and a secondary optical sensor 45, associated electrical connection wires 46, an emitting integrated circuit chip 47 provided with an optical emitter 48 and an associated electrical connection wire 49.

According to this exemplary embodiment, the electronic package 38 comprises a ring 50 made of an opaque material such as an opaque epoxy resin, for example of rectangular form, which extends over the front face 40 of the substrate wafer 39, around and at a distance from the emitting integrated circuit chip 47, and which passes above the receiving integrated circuit chip 43, between and at a distance from the optical sensors 44 and 45 so that the secondary optical sensor 45 and the optical emitter 48 are inside the ring 50.

The electronic package 38 comprises an encapsulation block 51 made of a transparent material, at least partially fills the space inside the opaque ring 50 on the front face and in which are embedded the emitting integrated circuit chip 45, the electrical connection wire 47 and the end part of the receiving integrated circuit chip provided with the secondary optical sensor 43.

The electronic package 38 comprises a main transparent plate 52, corresponding to the transparent plate 24 of the preceding example, placed on the receiving integrated circuit chip 43, above the main sensor 44 and outside the opaque ring 50.

The electronic package 38 also comprises an encapsulation block 53 made of an opaque material, for example an opaque epoxy resin, which extends over the front face 40 of the substrate wafer 39, around the opaque ring 50 and the part of the receiving integrated circuit chip 43 situated outside the opaque ring 50 and on this ring 50 around the transparent plate 52, and in which the electrical connection wires 46 are embedded.

According to a variant embodiment, the front faces of the opaque ring 50, of the transparent encapsulation block 51 and of the opaque encapsulation block 53 extend in the same front plan parallel to the front face of the substrate wafer 39, forming a front face 54, whereas the transparent plate 52 protrudes slightly toward the front.

The electronic package 38 also comprises a front strip 55, formed by a layer of an opaque material, for example an opaque epoxy resin or an opaque paint, which extends locally over the front face 54 above the secondary sensor 45, partially covering the transparent encapsulation block 51 so as to leave a front window 56 remaining above the optical emitter 48, this front window 56 being delimited by an edge 55a of the strip 55 and the part of the opaque ring 50 not covered and being offset laterally relative to the secondary sensor 45. In this window 56, the transparent encapsulation block 51 has an uncovered front face 51a. The front strip 55 delimits, at the front, in the opaque ring 50, a cavity 56a facing the secondary sensor 10, lying towards the front and open laterally on the side of the front window 56.

External electrical connection elements, such as metal balls 42a, linked to the electrical connection network 42, are placed on the rear face 41 of the substrate wafer 39.

The result of the above is that the light radiation emitted by the optical emitter 17 of the emitting integrated circuit chip 47 is emitted into the material of the transparent encapsulation block 51, is diffused in this block 51, is diffused towards the outside through the front window 56, that is to say, through the uncovered front face of the transparent encapsulation block 51, and reaches the secondary optical sensor 45 of the receiving integrated circuit chip 43. Moreover, the main optical sensor 52 of the receiving integrated circuit chip 43 receives the external light radiation through the transparent plate 52. The opaque ring 50 and the front strip 55 form a protection or a screen laterally and above the secondary sensor 10 against the outside light radiation.

The electronic package 38 can be obtained from collective fabrication that will now be described.

Figure 14:
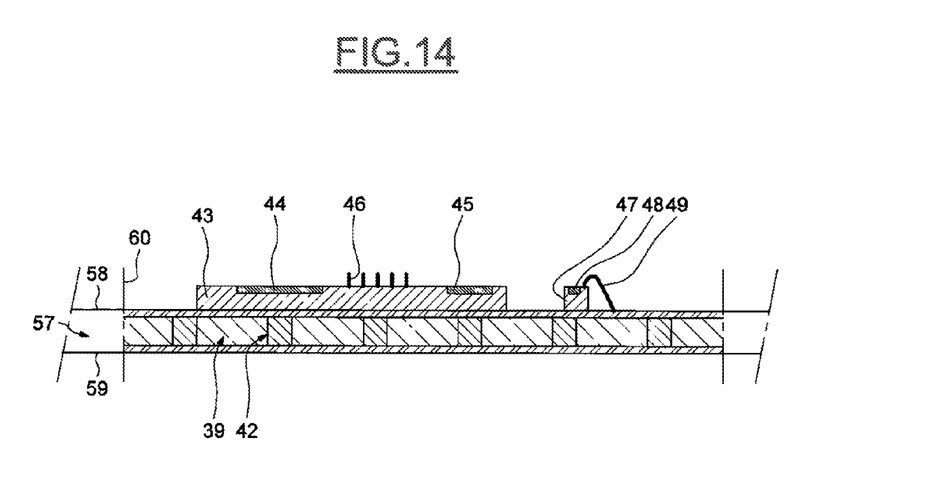
FIGS. 14 to 22 represent the fabrication steps for the electronic package of FIG. 1.
Figure 15:
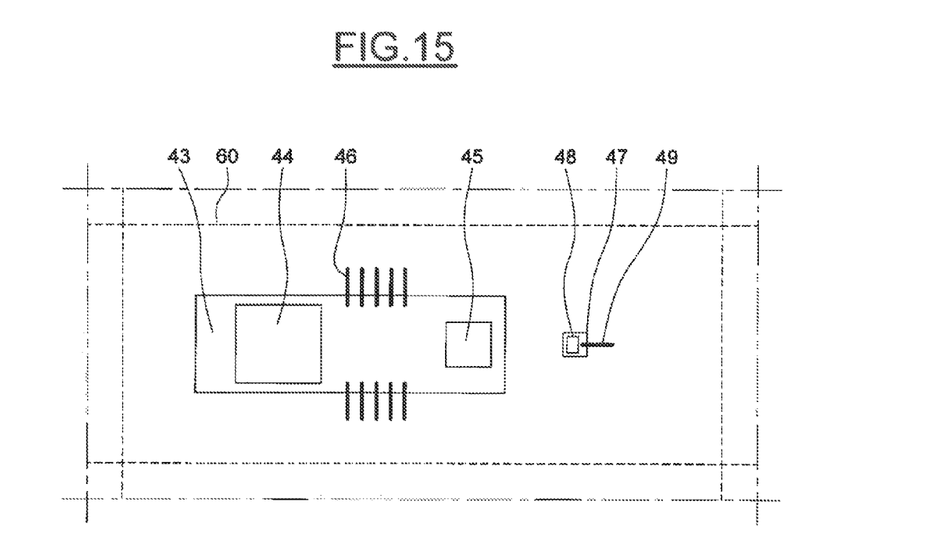

As illustrated in FIGS. 14 and 15, there is a collective substrate wafer 57 having front and rear faces 58 and 59, and having a plurality of adjacent placements 60 established according to a matrix and corresponding to a plurality of electronic packages 38 to be produced. In each placement 60, the collective substrate wafer 57 comprises an electrical connection network 42.

In each placement, the receiving integrated circuit chip 43 and the emitting integrated circuit chip 47 are installed and the electrical connection wires 46 and 49 are placed.

Figure 16:
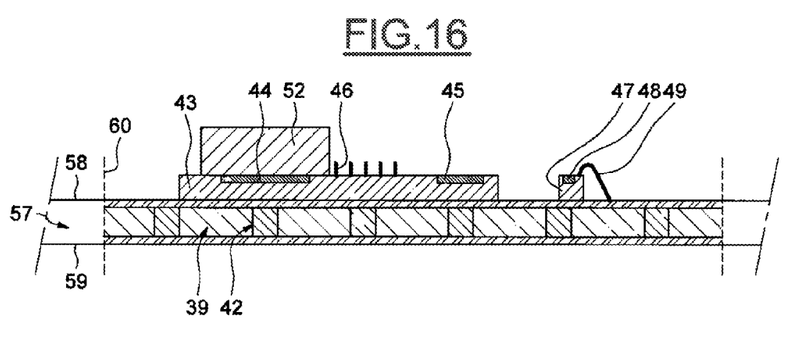

Then, as illustrated in FIG. 16, the transparent plate 52 is fixed to the main sensor 44 of the receiving integrated circuit chip 43, for example using a transparent glue.

Figure 17:
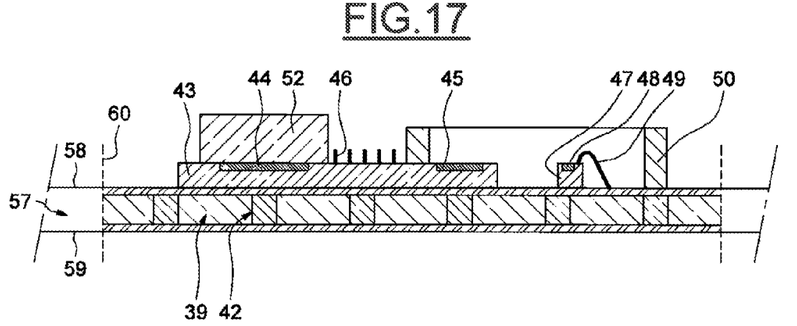
Figure 18:
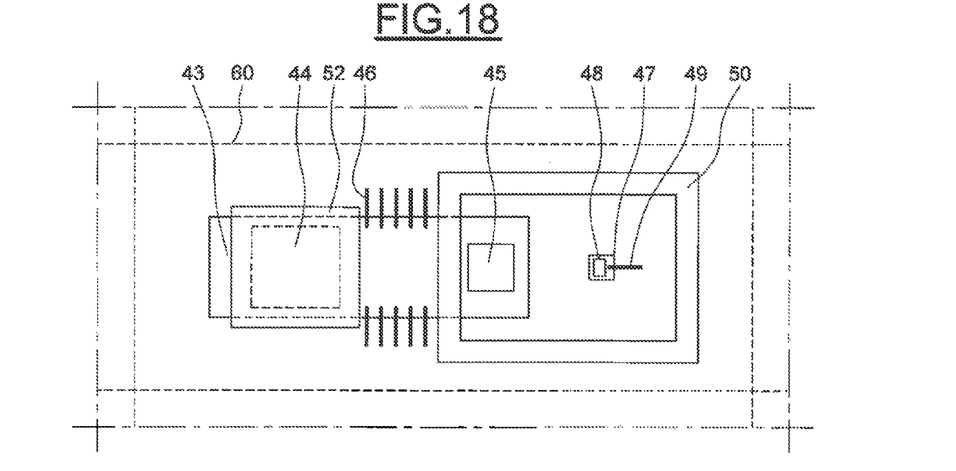

Then, as illustrated in FIGS. 17 and 18, the opaque ring 50 is formed, in each placement 60, for example by successive depositions of beads of material one on top of the other.

Figure 19:
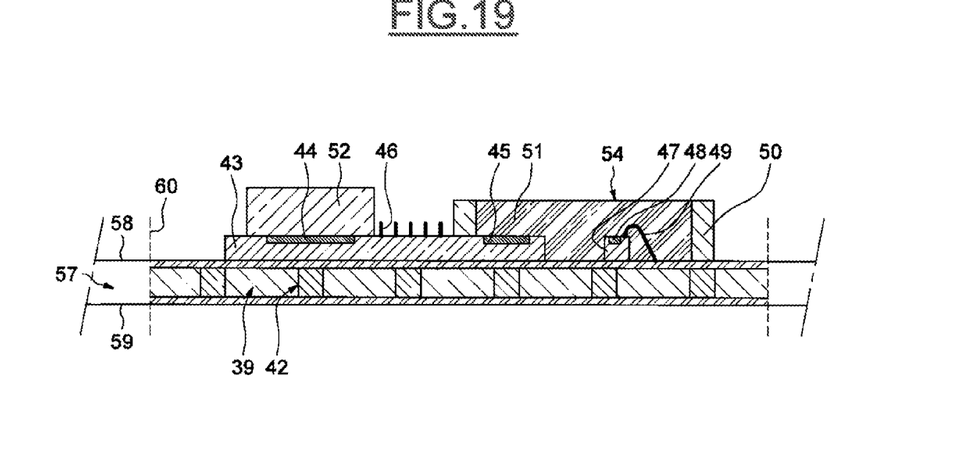

Then, as illustrated in FIG. 19, the opaque ring 50 is filled, in each placement 60, with a liquid material, which may be a transparent glue suitable for hardening under the effect of ultraviolet, radiation, so as to form, after hardening, the transparent encapsulation block 51.

Figure 20:
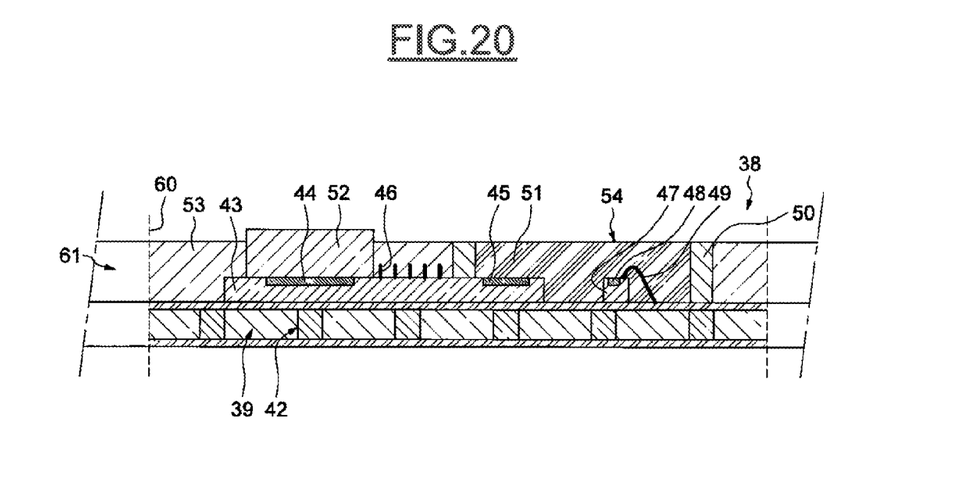

Then, as illustrated in FIG. 20, a layer 61 of a liquid material is spread which, after hardening, forms an opaque encapsulation block 53 in each placement 60.

Figure 21:
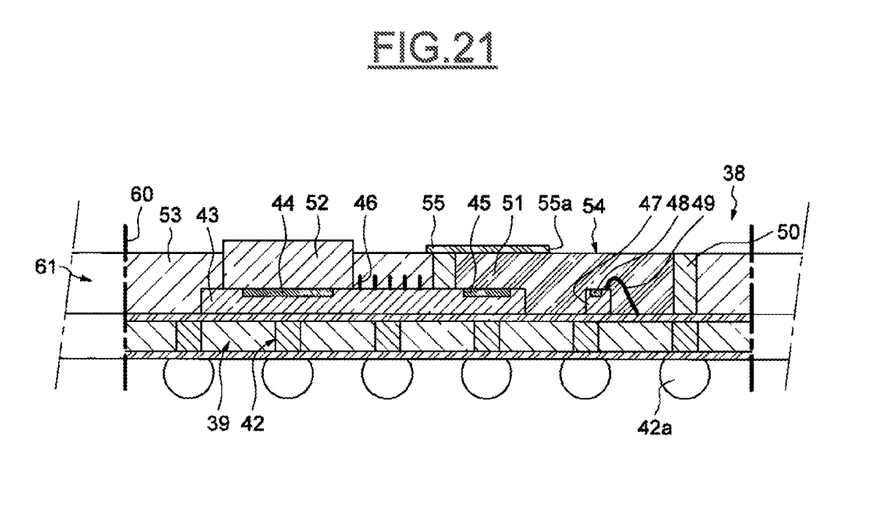
Figure 22:
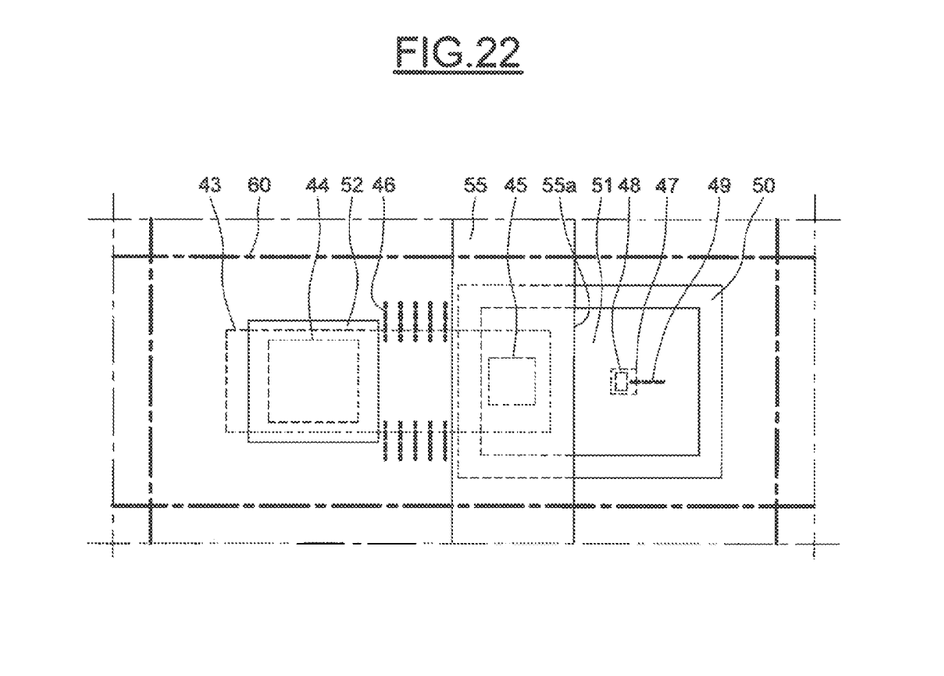

Then, as illustrated in FIGS. 21 and 22, large strips of opaque material are deposited which cross each placement 60 so as to form, in each placement, the strip 55.

Then, after having put in place the external electrical connection balls 42*a*, the different electronic packages 38 are singularized by cutting along the edges of the placements 60.

Generally, the various fabrication steps described can be obtained by implementing the conventional means used in the microelectronics field.

The electronic packages which have just been described could be installed inside the jacket or the shell of a portable or mobile telephone having openings facing the optical emitters and the main optical sensors, so as to form proximity sensors suitable for detecting the presence or absence of an object or of a part of the human body, in order to generate a particular command in the electronic circuits of the telephone.

Figure 23:
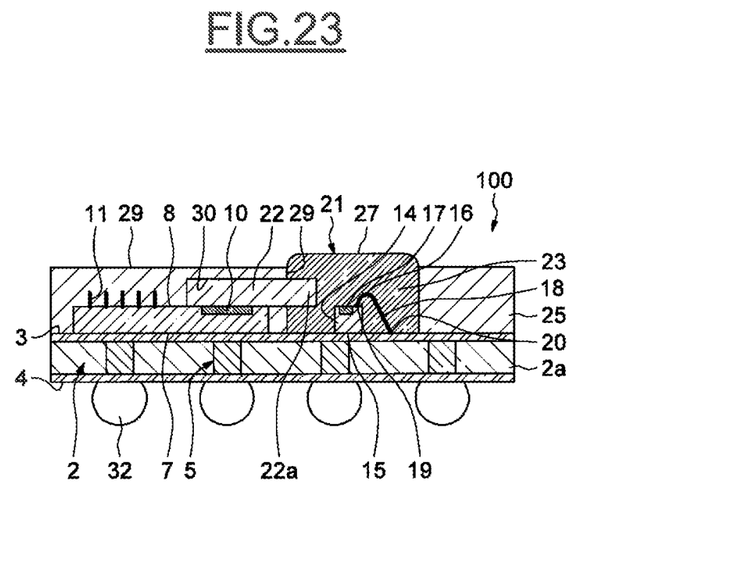
FIG. 23 represents a longitudinal cross section of another electronic package.

According to another embodiment illustrated on FIG. 23, an electronic package 100 is different from the electronic package 1 of FIG. 1 only by the fact that the receiving chip 6 comprises only the receiving sensor 10, the receiving sensor 9 and the main transparent plate 24 being absent. The opaque encapsulating block 25 is conformed to such a receiving chip 6 so as to encapsulate this chip 6 over the substrate wafer 2 in the same time as the transparent encapsulating means.

In this case, the light radiation emitted outside by the optical emitter 16 of the emitting chip 14 would be picked up by a sensor of a receiving chip of another package different from the package 100, directly or after a reflection on an object, for example for passage detection of an object or distance measurement. Any other using of the light radiation could be considered.

According to another employment, the receiving sensor 10 can be used as a controller of the good functioning of the emitter 17, for example for detecting that the radiation of the emitter 17 is present or absent or is under a normal or desired level, or simply to detect the level of the radiation.

The present invention is not limited to the examples described above. It is in particular obviously possible to combine the different arrangements of the electronic packages described differently. Many other variant embodiments are possible, without departing from the scope defined by the appended claims.

What is claimed is:

1. An electronic package, comprising:
a substrate wafer having a front face and a rear face;
an emitting integrated circuit chip having a rear face fixed to the front face of the substrate wafer and comprising a light radiation optical emitter;
a receiving integrated circuit chip having a rear face fixed to the front face of the substrate wafer and comprising at least one light radiation optical sensor;
a transparent encapsulant extending above the light radiation optical sensor and the light radiation optical emitter; and
an opaque encapsulant encapsulating the transparent encapsulant, this opaque encapsulant having a front window which is situated above the light radiation optical emitter and which is offset laterally relative to the light radiation optical sensor, so that the transparent encapsulant has an uncovered front face situated above the light radiation optical emitter and offset laterally relative to the light radiation optical sensor and so that the transparent encapsulant extends in a cavity of the opaque encapsulant, this cavity being blind towards the front and open laterally on the side of the front window such that the opaque encapsulant completely covers the light radiation optical sensor from above.

2. The package according to claim 1, wherein the transparent encapsulant comprises:
a transparent plate placed above the light radiation optical sensor; and
a transparent encapsulation block in which the receiving integrated circuit chip and at least a part of this transparent plate are embedded.

3. The package according to claim 1, wherein the transparent encapsulant comprises a transparent encapsulation block in which the emitting integrated circuit chip and at least the part of the receiving integrated circuit chip including the light radiation optical sensor are embedded.

4. The package according to claim 1, wherein the opaque encapsulant comprises an opaque encapsulation block in which the receiving integrated circuit chip and the transparent encapsulant are embedded.

5. The package according to claim 1, wherein the opaque encapsulant comprises an opaque ring inside which are placed the light radiation optical emitter and the light radiation optical sensor, and wherein the transparent encapsulant comprises a transparent encapsulation block formed in the opaque ring.

6. The package according to claim 5, wherein the opaque encapsulant also comprises a layer extending at least over the transparent encapsulation block and locally above the light radiation optical sensor.

7. The package according to claim 1, further comprising:
an additional front window in the opaque encapsulant; and
an additional light radiation optical sensor on said receiving integrated circuit chip which is situated in alignment with said additional front window.

8. The package according to claim 1, further comprising:
an external shell having an opening aligned with the uncovered front face of the transparent encapsulant.

9. An electronic package, comprising:
a substrate wafer having a front face and a rear face;
an emitting integrated circuit chip having a rear face fixed to the front face of the substrate wafer and comprising a light radiation optical emitter;

a receiving integrated circuit chip having a rear face fixed to the front face of the substrate wafer and comprising a first optical sensor of light radiation and a second optical sensor of light radiation;

a transparent encapsulant extending above the optical emitter and the second optical sensor;

a transparent plate situated above the first optical sensor; and an opaque encapsulant configured to encapsulate the transparent encapsulant and the transparent plate, said opaque encapsulant having a front window which is situated above the optical emitter and which is offset laterally relative to the second optical sensor, so that the transparent encapsulant has an uncovered front face situated above the optical emitter and offset laterally relative to the second optical sensor and so that the transparent encapsulant extends in a cavity of the opaque encapsulant, this cavity being blind to completely cover perpendicularly above the second optical sensor and open laterally on the side of the front window, said opaque encapsulant not covering said transparent plate and said opaque encapsulant passing between the first optical sensor and the second optical sensor.

10. The package according to claim 9, wherein the transparent encapsulant comprises:
a transparent plate placed above the second optical sensor; and
a transparent encapsulation block in which the receiving integrated circuit chip and at least a part of the transparent plate are embedded.

11. The package according to claim 9, wherein the transparent encapsulant comprises a transparent encapsulation block in which the emitting integrated circuit chip and at least part of the receiving integrated circuit chip including the second optical sensor are embedded.

12. The package according to claim 9, wherein the opaque encapsulant comprises an opaque encapsulation block in which the transparent encapsulant, a part of the receiving integrated circuit chip including the first optical sensor and, partially, the transparent plate are embedded.

13. The package according to claim 9, wherein the opaque encapsulant comprises an opaque ring inside which the optical emitter and the second optical sensor are placed, and wherein the transparent encapsulant comprises a transparent encapsulation block formed in the opaque ring.

14. The package according to claim 13, wherein the opaque encapsulant further comprises a layer extending at least over the transparent encapsulation block and locally above the second optical sensor so as to completely cover the second optical sensor.

15. The package according to claim 9, wherein the substrate wafer comprises an electrical connection network linked to said integrated circuit chips and provided with external electrical connection elements.

16. The package according to claim 9, further comprising:
an external shell having an opening aligned with the uncovered front face of the transparent encapsulant.

17. A portable or mobile telephone device, comprising:
a shell; and
a package mounted within the shell, said package comprising:
a substrate wafer having a front face and a rear face;
an emitting integrated circuit chip having a rear face fixed to the front face of the substrate wafer and comprising a optical emitter of light radiation;
a receiving integrated circuit chip having a rear face fixed to the front face of the substrate wafer and comprising at least one optical sensor of light radiation;
a transparent encapsulant extending above the optical sensor and the optical emitter; and
an opaque encapsulant encapsulating the transparent encapsulant, this opaque encapsulant having a front window which is situated above the optical emitter and which is offset laterally relative to the optical sensor, so that the transparent encapsulant has an uncovered front face situated above the optical emitter and offset laterally relative to the optical sensor and so that the transparent encapsulant extends in a cavity of the opaque encapsulant, this cavity being blind towards the front and open laterally on the side of the front window to completely cover perpendicularly above the optical sensor;
wherein the shell has at least one opening aligned with the uncovered front face of the transparent encapsulant.

18. The device according to claim 17 wherein the transparent encapsulant comprises:
a transparent plate placed above the optical sensor; and
a transparent encapsulation block in which the receiving integrated circuit chip and at least a part of this transparent plate are embedded.

19. The device according to claim 17, wherein the transparent encapsulant comprises a transparent encapsulation block in which the emitting integrated circuit chip and at least the part of the receiving integrated circuit chip including the optical sensor are embedded.

20. The device according to claim 19, further including an opaque ring encircling the transparent encapsulation block.

* * * * *